United States Patent [19]
Jaffe et al.

[11] Patent Number: 5,097,157

[45] Date of Patent: Mar. 17, 1992

[54] FAST CMOS BUS RECEIVER FOR DETECTING LOW VOLTAGE SWINGS

[75] Inventors: William S. Jaffe; Cheryl A. Ranson, both of Fort Collins, Colo.

[73] Assignee: Hewlett-Packard Company, Palo Alto, Calif.

[21] Appl. No.: 607,979

[22] Filed: Nov. 1, 1990

[51] Int. Cl.⁵ .............................. H03K 3/26; H03F 3/45
[52] U.S. Cl. .................................... 307/530; 307/279; 365/205; 365/207; 365/208
[58] Field of Search ............... 307/443, 451, 279, 330; 365/189.05, 205, 207-208

[56] References Cited

U.S. PATENT DOCUMENTS

| | | |
|---|---|---|
| 4,716,320 | 12/1987 | McAdams ............................. 365/205 |
| 4,785,206 | 11/1988 | Hosh ..................................... 365/205 |
| 4,843,264 | 6/1989 | Galbraith ............................. 365/207 |

Primary Examiner—Stanley D. Miller
Assistant Examiner—Margaret Rose Wambach

[57] ABSTRACT

A bus receiver includes a differential input amplifier circuits, a pair of source followers, and a sense amp having sense and latch modes. In a preferred embodiment of the invention, the bus receiver is implemented as a CMOS large scale integrated circuit comprising a plurality of FETs, and is capable of detecting ±0.2 volt transition of the data signal relative to a reference voltage for data signals having setup times as low as about 1 nanosecond.

22 Claims, 2 Drawing Sheets

FAST CMOS BUS RECEIVER FOR DETECTING LOW VOLTAGE SWINGS

FIELD OF THE INVENTION

The present invention relates generally to bus receivers for detecting the transition of a data signal appearing on a computer bus from one state to another. More particularly, the present invention relates to a bus receiver for use on a resistor pullup bus that is capable of detecting +/−0.2 volt transitions of the data signal relative to a reference voltage derived from a bias voltage of the bus and latching a value indicative of a last sensed state of the data signal for data signals having setup times as low as about one nanosecond.

BACKGROUND OF THE INVENTION

A critical consideration in the design of fast computer systems is the time required to perform data transfer operations. Data transfers usually involve transfers between memory and the CPU, but can also involve transfers between the CPU and a peripheral device, as well as transfers directly between memory and peripheral devices (i.e., direct memory access), and between CPUs.

One of the delays that occurs during a data transfer is in the bus receiver that interfaces the CPU, memory or peripheral device to the bus architecture. One function of the bus receiver is to detect transitions of data signals appearing on the bus. In synchronous systems, this usually involves detecting the state of the data signal at the time of a transition of a clock signal from one state to another. It will be appreciated that the time required to detect the state of the data signal upon a clock transition can impose serious limitations on overall system speed.

The aforementioned delay problem is exacerbated if the computer system employs a low voltage swing bus design. Some new generations of fast computer systems employ resistor pullup bus designs wherein the bus is biased at a predetermined voltage level, and the states of the data signal vary about a reference voltage that is derived from the bias voltage. Variations of the data signal about the bias voltage can be as low as 400 millivolts (i.e., +/−200 millivolts about the bias voltage). Reliable detection of low voltage swings can be difficult, particularly if the environment is electrically noisy. Thus, the bus receiver must not only be fast, but it must also be capable of accurately and reliably detecting low voltage swings in noisy environments.

Many of the known bus receiver designs are incapable of detecting transitions of low voltage data signals, particularly in high noise environments. Moreover, known bus receiver designs often have long setup and hold times, and thus result in high memory latency and poor overall system performance. Since, generally speaking, noise increases required setup and hold times (in addition to decreasing the reliability of detected data), the existence of noise slows down the bus receiver even further.

It is therefore desirable to provide a bus receiver that is capable of detecting transitions of low voltage data signals, particularly in noisy environments, and that is also fast, but yet simple, reliable and inexpensive to implement. The present invention achieves these goals.

SUMMARY OF THE INVENTION

A bus receiver for detecting voltage swings of a data signal on a databus comprises a differential input amplifier circuit, a pair of source followers, and a latch circuit. The differential input amplifier circuit receives at inputs thereof a data signal from the bus and a reference voltage derived from a bus bias voltage for providing first and second output signals having states indicative of the data signal relative to the reference voltage. The second output signal is substantially complementary to the first output signal.

Each one of the source followers receives a different one of the first and second output signals, and each receives both a clock signal and its complement. The source followers are responsive to the states of the first and second output signals to provide third and fourth output signals having states indicative of the states of the first and second output signals, respectively, only when the clock signal is in a first state.

The latch circuit has sense and latched modes, and receives the third and fourth output signals and the clock signal. The latch circuit is responsive to the occurrence of the first state of the clock signal to sense the states of the third and fourth output signals occurring during the occurrence of the first state of the clock signal. The latch circuit is responsive to the occurrence of a second, opposite state of the clock signal to latch values indicative of the states of the third and fourth output signals last sensed upon a transition of the clock signal from the first state to the second state. The latched values are therefore indicative of the magnitude of the data signal relative to the reference voltage (i.e., whether the data signal is greater than or less than the reference voltage) at the time of the transition.

The bus receiver circuit is embodied as a plurality of FETs in a CMOS integrated circuit, such as, but not limited to, a CMOS large scale integrated circuit. The FETs are symmetrically arranged about a centerline of the circuit layout so that no bias is introduced into the circuit and so that any differential noise component in opposing portions of the circuit layout is substantially eliminated.

The described bus receiver is capable of detecting voltage swings of the data signal as low as +/−0.2 volts relative to the reference voltage. The described bus receiver is also capable of latching values indicative of a last sensed state of the data signal for data signals having setup times as low as about one nanosecond.

DETAILED DESCRIPTION OF THE DRAWINGS

Figure 1:
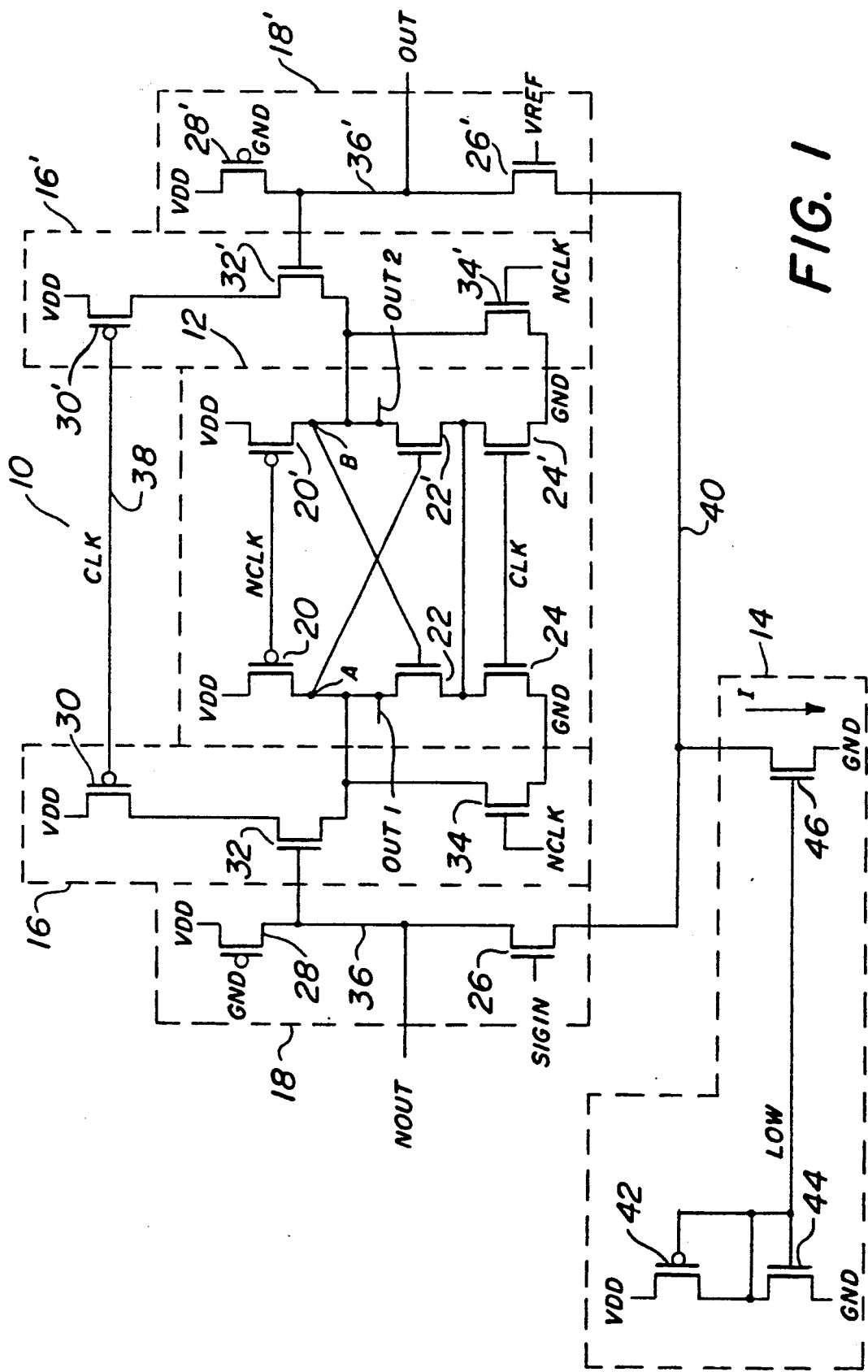
FIG. 1 is a circuit diagram of a bus receiver according to the present invention.

Referring to the drawings, wherein like numerals represent like elements, there is shown in FIG. 1 a circuit diagram of a bus receiver 10 according to present invention. The bus receiver 10 comprises a latch circuit 12 (embodied as a conventional RAM sense amp), a pair of source followers 16, 16', and a differential input amplifier defined by circuits 18, 18' and a current source 14. As shown, the circuit 10 is embodied as a plurality of NFETs (n-channel field effect transistors) and PFETs (p-channel field effect transistors).

The differential input amplifier has an input labeled SIGIN for receiving the data signal appearing on the bus, and an input labeled VREF for receiving a reference voltage. In the event that the bus receiver 10 is employed to detect data signals on a biased resistor pullup bus, then the reference voltage VREF is preferably derived from the bias voltage, e.g., through a resistor divider circuit. In one embodiment of the invention, the bias voltage of the bus is 3 volts, and the reference voltage is derived from the bias voltage via a resistor divider circuit to obtain a reference voltage of about 2.2 volts, $+/-50$ millivolts.

Each differential input amplifier circuit 18, 18' comprises a PFET 28, 28' coupled to an NFET 26, 26' in drain-source series relationship with the current source 14 via line 40, as shown. The current source 14 comprises a PFET 42 coupled to NFETs 44, 46 so as to allow only a fixed current I to flow therethrough to ground, as shown. The gate of each of the PFETs 28, 28' is coupled to ground, while the source terminal of each is coupled to a voltage source, $V_{DD}$, also as shown. The gate of the NFET 26 of the first circuit 18 receives the data signal SIGIN, while the gate of the NFET 26' of the second circuit 18' receives the reference voltage VREF. The PFETs 28, 28' should be electrically matched to each other, and the NFETs 26, 26' should be electrically matched to each other. The details of the electrical matching will be provided hereinafter. It will be appreciated from FIG. 1 that the arrangement of the FETs 28, 26 of the first circuit 18 is both physically and electrically symmetrical (about a centerline of the circuit layout of bus receiver 10) with the FETs 28', 26' of the second circuit 18'. Importantly, the threshold voltage of the NFETs 26, 26' should be nearly identical.

Figure 2:
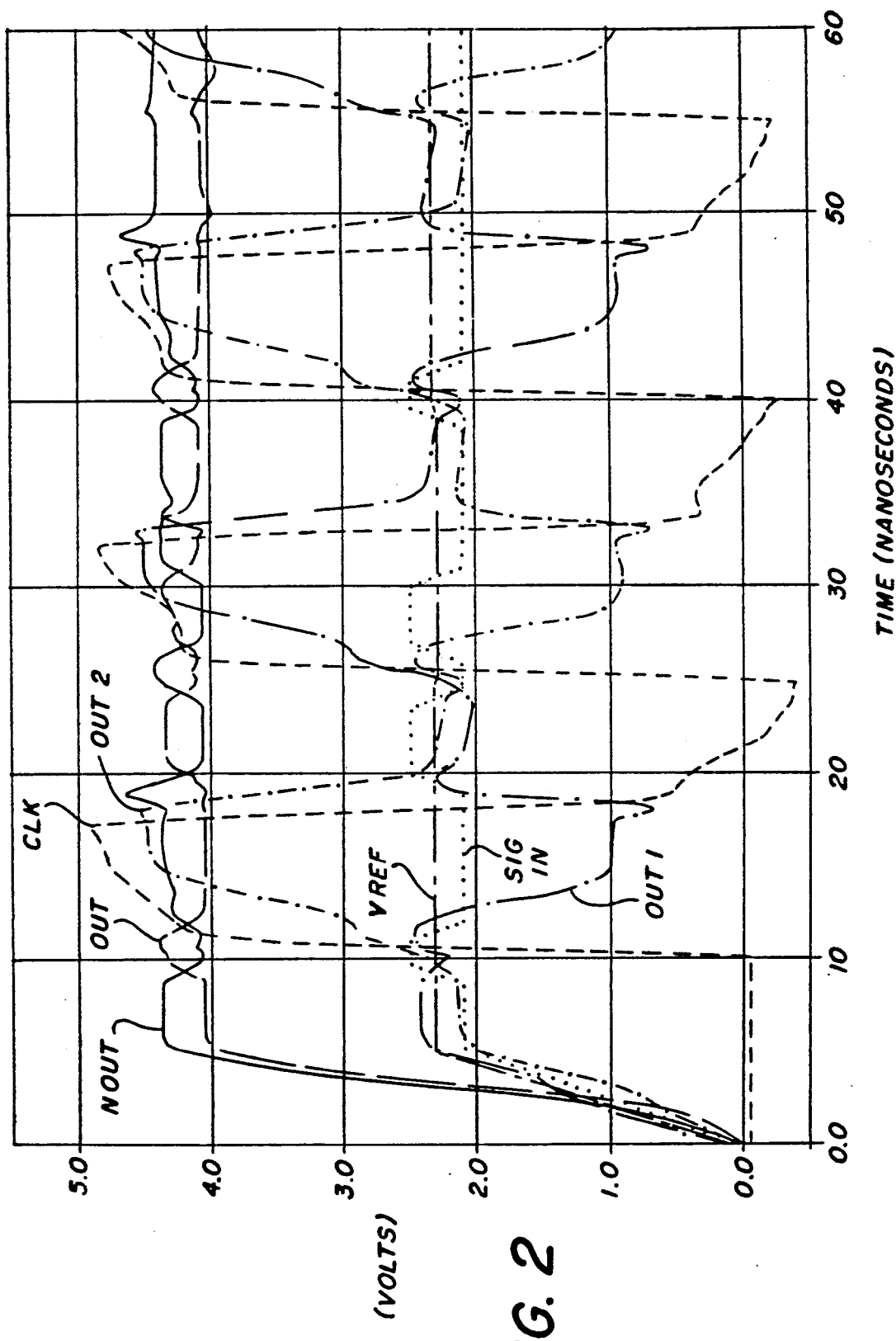
FIG. 2 is an exemplary timing diagram illustrating operation of the circuit of FIG. 1.

The operation of the differential input amplifier is as follows. Assuming that the magnitude of the voltage $V_{DD}$ is 5 volts, and assuming sizing of the PFETs 28, 28' relative to the NFETs 26, 26' as described hereinafter, the lines 36, 36' will be DC biased at about 4 volts. The circuit of FIG. 2 illustrates the operation of the differential input amplifier 18, 18' (as well as the rest of the circuitry) for a reference voltage VREF of about 2.2 volts. Upon a transition of the data signal SIGIN above the reference voltage VREF, the gate-source voltage $V_{GS}$ of NFET 26 will exceed the gate-source voltage $V_{GS}$ of NFET 26', causing more current to flow through the circuit 18 than through the circuit 18' (the combined current flowing through both of the circuits 18, 18' is limited, i.e., to 0.8 mA, by the current source 14; the voltage on line 40 will vary to keep the current I nearly constant). This causes the output NOUT of circuit 18 to be of lower magnitude than the output OUT of the circuit 18', as shown in FIG. 2. Alternatively, upon a transition of the data signal SIGIN below the magnitude of the reference voltage VREF, the gate-source voltage $V_{GS}$ of the NFET 26' will be greater than the gate-source voltage $V_{GS}$ of the NFET 26, thus causing more current to flow through the circuit 18' than through the circuit 18. This causes the magnitude of the output NOUT of circuit 18 to exceed that of the output OUT of the circuit 18', as also shown in FIG. 2. Note that the outputs NOUT and OUT are DC biased at the DC bias level of lines 36, 36' as shown in FIG. 2.

The output signals NOUT, OUT are provided at drain-source nodes of the FETs 28, 26, and 28', 26', respectively, as shown in FIG. 1.

It will therefore be appreciated that the differential input amplifier provides first and second output signals (NOUT, OUT) having states indicative of the magnitude of the data signal SIGIN relative to the reference voltage VREF, and that the first and second output signals are substantially complementary to each other. When the differential input amplifier circuits 18, 18' are Constructed as hereindescribed, it will detect voltage swings of the data signal SIGIN relative to the reference voltage VREF of as low as 0.2 volt.

The function of the source followers 16, 16' is to provide third and fourth output signals OUT1, OUT2, indicative of the status of the output signals NOUT, OUT only when a clock signal CLK is in a first state, and to essentially disregard the status of the output signals NOUT and OUT when the clock signal CLK is in a second state. In the exemplary timing diagram of FIG. 2, the first and second states of the clock signal CLK are low and high, respectively.

Each source follower 16, 16' is also defined by a plurality of FETs coupled in drain-source series relationship between the voltage source $V_{DD}$ and ground, as shown. In particular, PFETs 30, 30' are coupled in drain-source series relationship with NFETs 32, 32', which in turn are coupled in drain-source series relationship with NFETs 34, 34'. The PFETs 30, 30' should be electrically matched to each other. Similarly, the NFETs 32, 32' should be electrically matched to each other, and the NFETs 34, 34' should be electrically matched to each other. The details of the electrical matching will be provided hereinafter. As in the case of the differential input amplifier 18, 18', the FETs comprising the pair of source followers 16, 16' are symmetrically arranged about the centerline of the circuit layout of the bus receiver 10, as in evident from an inspection of FIG. 1.

The gate terminals of the PFETs 30, 30' each receive the clock signal CLK on line 38, while the gates of NFETs 34, 34' each receive the complement of the clock signal NCLK. The gate terminal of the NFET 32 receives the output signal NOUT, while the gate of NFET 32' receives the output signal OUT.

The operation of each of the source followers 16, 16' is as follows. Reference is made to FIG. 2. When the clock signal CLK is in the first state (low), then PFETs 30, 30' and NFETs 34, 34' are biased to a generally highly conductive (i.e., generally low impedance) condition, thereby allowing NFETs 32, 32' to operate in accordance with the status of the output signals NOUT, OUT. Thus, the NFETS 32, 32' provide the third and fourth output signals OUT1, OUT2, to the latch 12 during this time. As will be appreciated hereinafter, the latch 12 is in a sense mode when the source followers 16, 16' are in this state. Alternatively, when the clock signal CLK is in a second, opposite state (high), the PFETs 30, 30' and NFETs 34, 34' are biased to generally low conductivity (i.e., generally high impedance), whereby the NFETs 32, 32' are not significantly influenced by the states of these signals during this time, and the output signals OUT1 and OUT2 are not provided by the source followers 16, 16' during this time. The source followers 16, 16' therefore ensure that the NOUT and OUT nodes 36, 36' are isolated from the output of the circuit 10.

The latch 12 may be a conventional, well-known RAM sense amp. As shown in FIG. 1, the latch 12 comprises a pair of cross coupled circuits, with each circuit comprising a plurality of FETs coupled in drain-source series relationship between the voltage source and ground. In particular, each circuit comprises a PFET 20, 20' coupled in drain-source series relationship with an NFET 22, 22', which in turn is coupled in drain-source series relationship with an NFET 24, 24'. The drain of the PFET 20 is cross coupled to the gate of the NFET 22', while the drain of the PFET 20' is cross coupled to the gate of the NFET 22 as shown. In addition, the drains of the NFETs 22, 22' are cross coupled to each other.

The PFET 20 should be electrically matched to the PFET 20' while the NFET 22 should be electrically matched to the NFET 22', and the NFET 24 should be electrically matched to the NFET 24'. The details of the electrical matching are provided hereinafter. As will be apparent from FIG. 1, and as in the case of the differential input amplifier circuits 18, 18' and source followers 16, 16', the FETs defining the latch circuit 12 should be symmetrically arranged about the centerline of the circuit layout of the bus receiver 10.

The drain-source node A disposed between the PFET 20 and the NFET 22 receives the output signal OUT1. Similarly, the drain-source node B disposed between the PFET 20' and the NFET 22' receives the output signal OUT2. The gate terminals of the NFETs 24, 24' receive the clock signal CLK, while the gate terminals of the PFETs 20, 20' receives its complement NCLK. It will be appreciated that when the clock signal CLK is in the first state (low) the PFETS 20, 20' and NFETs 24, 24' will be biased to a relatively low conductance (i.e., generally high impedance) condition. This defines the sense mode of the latch 12. During this time, the latch 12 simply receives and monitors the output signals OUT1, OUT2, provided by the source followers 16, 16'. However, upon a transition of the clock signal CLK from the first state to the second state (high), the PFETs 20, 20' and NFETs 24, 24' are biased to a generally highly conductive (i.e., generally low impedance) condition, placing the latch 12 in a latch mode. The output signals OUT1, OUT2 will thereby be caused to assume a voltage level that tends toward either $V_{DD}$ or ground, depending upon the last sensed state of the signals OUT1, OUT2 at the time of the transition of the clock signal CLK from the first state (low) to the second state (high). During the time that the clock signal CLK is in the second (high) state, the latch 12 will be unaffected by changes in the NOUT and OUT output signals.

Thus, the function of the latch 12 is to sense the status of the third and fourth output signals OUT1, OUT2 when the clock signal is in the first state (low) and latch values indicative of the states of the third and fourth output signals OUT1, OUT2 last sensed upon a transition of the clock signal from the first state (low) to the second state (high). Therefore, the latched values are indicative of the status of the data signal SIGIN relative to the reference voltage VREF at the time of the transition of the clock signal from the first state to the second state.

When the circuit 10 is constructed as hereindescribed, the data appearing at the SIGIN input of FET 26 may have a setup time as low as 1 nanosecond, i.e., valid data may appear at the input up to 1 nanosecond before a clock transition and the circuit 10 will latch valid data.

The signals OUT1, OUT2 may be latched with an ordinary D-type latch although the electrical characteristics of the D-type latch should be such that it is compatible with the bus receiver circuit 10. When the bus receiver circuit 10 is constructed as hereindescribed, a D-type latch having a $V_{IL}$ of about 1 volt and a $V_{IH}$ of about 2 volts (which is close to TTL levels) will suffice.

The symmetry of the described bus receiver 10 prevents any electrical biasing of the circuit in one direction or the other. This symmetry also ensures that no substantial differential noise will appear in symmetrically opposed portions of the circuit, due to its common mode rejection characteristic.

Another consideration in the design and operation of the hereindescribed bus receiver circuit 10 is that the absolute levels of the data signal SIGIN and the reference voltage VREF must be within a pre-defined range, although the actual range is process dependent.

The bus receiver circuit 10 described herein will perform optimally when embodied in a CMOS large scale integrated circuit, although NMOS technology may be employed as well. When the circuit is embodied in a CMOS large scale integrated circuit, the following chart may be employed for sizing the various FETs of the circuit 10.

| FET | Size (width/length in microns) |
| --- | --- |
| 30, 30' | 30/1 |
| 28, 28' | 7/1 |
| 32, 32' | 20/1 |
| 20, 20' | 10/1 |
| 22, 22' | 12/1 |
| 26, 26' | 30/1 |
| 34, 34' | 3/1 |
| 24, 24' | 60/1 |
| 42 | 3/1 |
| 44 | 10/1 |
| 46 | 20/1 |

Preferably the matched FETs 32, 32'; 22, 22'; 20, 20'; and, 34, 34' each have a VT of within about $+/-20$ millivolts.

In a preferred CMOS VLSI implementation of the invention, 1 um FETs ($NL_{eff}=0.85$ um, $PL_{eff}=0.88$ um) operating at 5 volts in circuits with up to three levels of aluminum are employed. Low gate and contact resistance is provided by self-aligned silicidation of the polysilicon and diffusions. The minimum pitch of the first and second metal layers is 2.0 um, while the minimum pitch of the third layer is 6.0 um. The contacted pitch at metal 1 and 2 is 2.6 um. A P epitaxial layer on the P +substrate is provided for improved latchup immunity. The following rules should be followed to minimize the effects of other parasitic devices. All N-channel MOSFETs should be formed by crossing the polysilicon and N-island, while the P-channel MOSFETs should be formed by crossing the polysilicon and P-islands. The following chart provides structural and operating parameters that should be considered in the practice of the preferred embodiment of the invention.

| Parameter | Parameter Data |
| --- | --- |
| $L_{drawn}$ n/p (micron) | 1.0/1.0 |
| $L_{eff}$ n/p (micron) | 0.85/0.88 |
| Worst case frequency (MHz) | 50 |
| Metal 1 contacted pitch (um) | 2.6 |
| Metal 2 contacted pitch (um) | 2.6 |
| Metal 3 contacted pitch (um) | 6.0 |
| Typical gate delay (pS) | 160 |
| Standby Leakage current (nA) | less than 100 |
| Off-state Leakage current (fA) | less than 300 |

| Parameter | Parameter Data |
| --- | --- |
| Max operating temperature (°C.) | 110 |
| I/O output drive (mA) | 100 |
| Low power consumption (nW/gate/MHz) | 650 |
| Pad pitch (um) | 150 |
| Power Supply (Volt) | 5 |
| ESD specification (Volt) | 1500 |
| Latchup immunity (mA) | 200 |
| Io$_{sat}$/W n/p (uA/um) | 329/159 |
| Minimum SRAM cell size (um$^2$) | 150 |

The present invention may be embodied in other specific forms without departing from the spirit or essential attributes thereof and, accordingly, reference should be made to the appended claims rather than to the foregoing specification, as indicating the scope of the invention.

We claim:

1. Apparatus for detecting voltage swings of a data signal on a databus comprising:

a) first means for comparing a voltage level of the data signal to a reference voltage and providing first signals indicative of the result of the comparison, said first means comprising a FET current source and a pair of circuits each having at least two FETs coupled in drain-source series relationship to said FET current source;

b) second means for receiving the first signals and receiving clock signals associated with the databus and for providing second signals indicative of a status of the first signals only during times when the clock signals are in a first state, said second means comprising a second pair of circuits each of which comprises a plurality of FETs coupled in drain-source series relationship between a voltage source and ground, there being corresponding, electrically matched FETs in each of said circuits of said second pair of circuits; and, c) third means receiving the second signals and the clock signals for sensing a status of the second signals when the clock signals are in the first state and latching values indicative of the status of the second signals last sensed upon a transition of the clock signals from the first state to a second, opposite state, the latched values being indicative of a status of the data signal relative to the reference voltage.

2. Apparatus according to claim 1 wherein the first means comprises means for detecting at least about +/−0.2 volt swing of the data signal from the reference voltage and providing the first signals accordingly.

3. Apparatus according to claim 2 Wherein the data signal has a setup time and the latched values are valid indications of the status of the data signal for setup times as low as about 1 nanosecond.

4. Apparatus according to claim 1 wherein the databus is a resistor pullup bus biased to a predetermined voltage level and the reference voltage is derived from the predetermined voltage level.

5. Apparatus according to claim 1 wherein the first, second and third means are each embodied as a plurality of FETs and all of the FETs are symmetrically arranged in a circuit layout about a center line of the circuit layout for substantially eliminating an differential noise component in opposing portions of the circuit layout.

6. Apparatus according to claim 5 wherein the first, second and third means are embodied in a single CMOS integrated circuit.

7. Apparatus according to claim 5 wherein, for each FET in one portion of the symmetrical arrangement, there is a corresponding electrically matched FET in an opposing position of the symmetrical layout.

8. Apparatus according to claim 1 wherein the first means comprises a FET differential input amplifier.

9. Apparatus according to claim 1 wherein the second means comprises a pair of FET source followers.

10. Apparatus according to claim 1 wherein the third means comprises a FET RAM sense amplifier.

11. Bus receiver circuit comprising:

a) a differential input amplifier circuit, receiving at inputs thereof a data signal from the bus and a reference voltage, for providing first and second output signals having states indicative of the magnitude of the data signal relative to the reference voltage, the second output signal being substantially complementary to the first output signal;

b) a pair of source followers, each receiving a different one of the first and second output signals and each receiving clock signals, the source followers being responsive to the states of the first and second output signals to provide third and fourth output signals having states indicative of the states of the first and second output signals, respectively, only when the received clock signals are in a first state, but being substantially nonresponsive to the states of the first and second output signals when the received clock signals are in a second state that is substantially opposite the first state; and, c) a latch circuit having sense and latched modes and receiving the third and fourth output signals and the clock signals, the latch circuit being responsive to the occurrence of the first state of the clock signals to sense the states of the third and fourth output signals occurring during the occurrence of the first state of the clock signals, and being responsive to the occurrence of the second state of the clock signals to latch values indicative of the states of the third and fourth output signals last sensed upon a transition of the clock signals from the first state to the second state, the latched values being indicative of the magnitude of the data signal relative to the reference voltage.

12. Bus receiver according to claim 11 wherein the differential input amplifier comprises a pair of circuits each having a first plurality of FETs coupled in drain-source series relationship to a FET current source, a gate of one of the FETs in each pair of circuits defining the inputs, and a drain-source node of each pair of circuits providing the first and second output signals, there being corresponding, electrically matched FETs in each pair of circuits.

13. Bus receiver according to claim 12 wherein each source follower comprises a second plurality of FETs coupled in drain-source series relationship between a voltage source and ground, there being corresponding, electrically matched FETs in each source follower, a gate of one of the FETs in each of the source followers receiving the first and second output signals, a pair of FETs in each of the source followers having gates receiving the clock signals, a drain-source node of each source follower providing the third and fourth output signals.

14. Bus receiver according to claim 13 wherein the latch circuit comprises a third and a fourth plurality of FETs each coupled in drain-source series relationship between the voltage source and ground and cross coupled to each other, there being corresponding, electrically matched FETs in each of the third and fourth plurality of FETs, a pair of FETs in each of the third and fourth plurality of FETs having gates receiving the clock signals.

15. Bus receiver according to claim 12 wherein the FETs having the gates defining the inputs each have threshold voltages, and the threshold voltages are substantially equal.

16. Bus receiver according to claim 1 wherein the FETs in each of said differential amplifier, said source followers, and said latch circuit are disposed in a circuit layout and are substantially symmetrically disposed about a centerline of the circuit layout.

17. Bus receiver according to claim 16 wherein there is no substantial differential noise component in opposing symmetrical portions of the circuit layout.

18. Bus receiver according to claim 11 wherein the differential input amplifier, source followers and latch circuit are embodied in a CMOS integrated circuit.

19. Bus receiver according to claim 11 wherein the differential input amplifier is configured to detect at least about +/−0.2 volt variation of the data signal from the reference voltage and provide said first and second output signals accordingly.

20. Bus receiver according to claim 19 wherein the data signal has a setup time and the latch values are valid indications of the magnitude of the data signal relative to the reference voltage for setup times as low as about 1 nanosecond.

21. Bus receiver according to claim 11 wherein the bus comprises a resistor pullup bus biased at a predetermined voltage level and the reference voltage is derived from the predetermined voltage level.

22. Bus receiver for detecting voltage swings of a data signal on a resistor pullup databus biased to a predetermined voltage level comprising:

a) a differential input amplifier defined by first and second circuits and a FET current source for providing indications of at least about +/−0.2 volt variation of the data signal relative to a reference voltage derived from the predetermined voltage level, each circuit comprising plural FETs coupled in drain-source series relationship between a voltage source and the FET current source, there being corresponding, substantially electrically matched, FETs in each circuit, a gate of one of the FETs of the first circuit receiving the data signal and a gate of one of the FETs of the second circuit biased at the reference voltage, a drain-source node of each circuit providing first and second substantially complementary output signals having states indicative of the magnitude of the data signal relative to the reference voltage;

b) first and second source followers for selectively providing third and fourth substantially complementary output signals indicative of the states of the first and second output signals, each source follower comprising plural FETs coupled in drain-source series relationship between the voltage source and ground, there being corresponding, substantially electrically matched, FETs in each source follower, a gate of one of FETs of the first source follower receiving the first output signal and a gate of one of the FETs of the second source follower receiving the second output signal, a gate of a plurality of remaining FETs of the first and second source followers each receiving one of a clock signal or a complement of the clock signal, a drain-source node of each source follower providing the third and fourth output signals only when the clock signal is in a first state;

c) a latch defined by third and fourth cross coupled circuits each comprising plural FETs coupled in drain-source series relationship between the voltage source and ground, there being corresponding, substantially electrically matched, FETs in each of the third and fourth circuits, a drain-source node of each of the third and fourth circuits receiving the third and fourth output signals, a gate of a plurality of remaining FETs of the third and fourth circuits each receiving one of the clock signal or the complement of the clock signal, the latch being responsive to sense states of the third and fourth output signals occurring during the occurrence of the first state of the clock signal, and being responsive to latch values indicative of the states of the third and fourth output signals last sensed upon a transition of the clock signal from the first state to a second, opposite state, the data signal having a setup time and the latched values being valid indications of the magnitude of the data signal relative to the reference voltage for setup times as low as about 1 nanosecond;

all of the FETs being symmetrically arranged about a center line of a circuit layout for substantially eliminating any differential noise component in opposing portions of the circuit layout and all being embodied in a single CMOS integrated circuit.

* * * * *